(12) United States Patent
Higuchi et al.

(10) Patent No.: US 7,310,862 B2
(45) Date of Patent: *Dec. 25, 2007

(54) METHOD FOR MANUFACTURING A PIEZOELECTRIC DEVICE

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation (JP)

( * ) Notice: Subject to any disclaimer, the term of this patent is extended or adjusted under 35 U.S.C. 154(b) by 259 days.

This patent is subject to a terminal disclaimer.

(21) Appl. No.: 11/000,517

(22) Filed: Nov. 30, 2004

(65) Prior Publication Data

US 2005/0162043 A1    Jul. 28, 2005

(30) Foreign Application Priority Data

Dec. 1, 2003 (JP) ............................. 2003-401184

(51) Int. Cl.
*H01L 41/22* (2006.01)

(52) U.S. Cl. .............. 29/25.35; 29/25.42; 29/594; 29/595; 310/311; 333/195

(58) Field of Classification Search .............. 29/25.35, 29/25.42, 890.1, 846, 595, 594; 310/328, 310/311, 313 R, 313 A; 204/192.34, 192.33, 204/192.35; 219/121.69, 121.71; 250/492.1, 250/492.3; 347/68–71; 333/195

See application file for complete search history.

(56) References Cited

U.S. PATENT DOCUMENTS

| | | | | |
|---|---|---|---|---|
| 5,130,294 A | * | 7/1992 | Char | 505/220 |
| 5,168,078 A | * | 12/1992 | Reisman et al. | 438/455 |
| 5,449,659 A | * | 9/1995 | Garrison et al. | 505/330 |
| 5,650,362 A | * | 7/1997 | Nashimoto | 427/126.3 |
| 5,898,020 A | * | 4/1999 | Goyal et al. | 505/239 |
| 6,198,208 B1 | * | 3/2001 | Yano et al. | 310/358 |
| 6,436,317 B1 | * | 8/2002 | Malozemoff et al. | 252/519.1 |

FOREIGN PATENT DOCUMENTS

| | | |
|---|---|---|
| JP | 06-145977 | 5/1994 |
| JP | 10-231122 | 9/1998 |

* cited by examiner

*Primary Examiner*—Minh Trinh
*Assistant Examiner*—Tai Van Nguyen
(74) *Attorney, Agent, or Firm*—Harness, Dickey & Pierce, P.L.C.

(57) ABSTRACT

A method is provided for effectively manufacturing a piezoelectric device equipped with a piezoelectric film with a crystal orientation that is aligned in a desired direction. An interlayer which partially has a layer formed by an ion beam assisted laser ablation method while controlling a temperature rise accompanied by an ion beam irradiation by a cooling device and is bi-axially oriented as a whole, is formed on a surface of a substrate. A lower electrode is formed on the interlayer. A piezoelectric film is formed on the lower electrode. An upper electrode is formed on the piezoelectric film. The lower electrode and the piezoelectric film are formed by epitaxial growth.

3 Claims, 4 Drawing Sheets

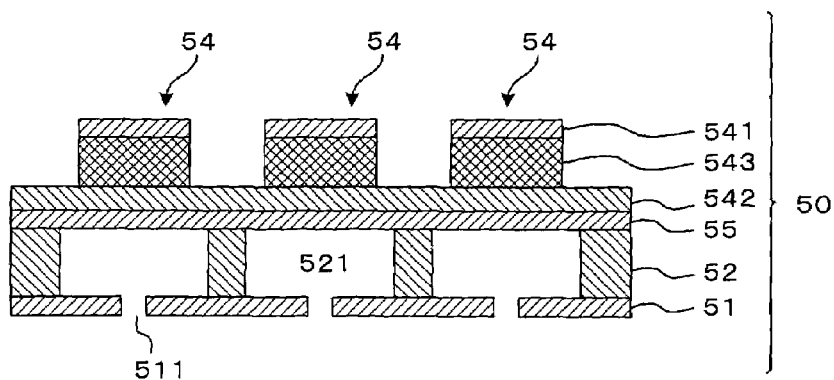
FIG. 1
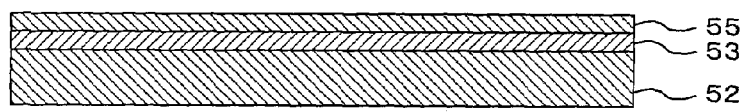
FIG. 2 [1C]
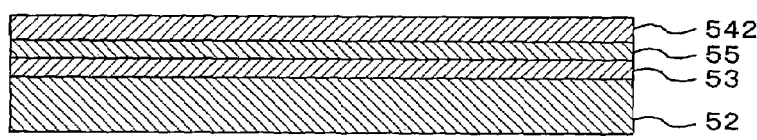
FIG. 2 [2C]
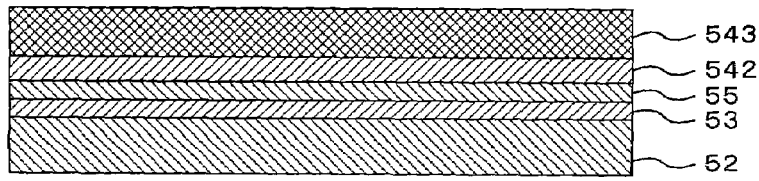
FIG. 2 [3C]
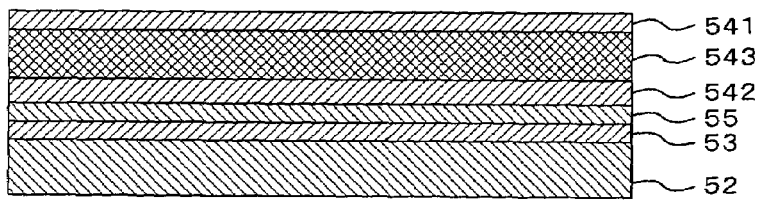
FIG. 2 [4C]
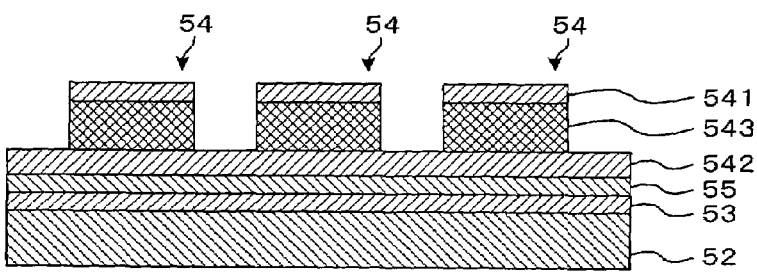
FIG. 2 [5C]

METHOD FOR MANUFACTURING A PIEZOELECTRIC DEVICE

RELATED APPLICATIONS

This application claims priority to Japanese Patent Application No. 2003-401184 filed Dec. 1, 2003 which is hereby expressly incorporated by reference herein in its entirety.

BACKGROUND

1. Technical Field

The present invention relates to a piezoelectric device equipped with a piezoelectric film and a pair of electrodes sandwiching the film, and a liquid jet head and a liquid jet apparatus equipped with the piezoelectric device, and more particularly, to a piezoelectric device equipped with a piezoelectric film having excellent orientations.

2. Related Art

As piezoelectric films that are used for piezoelectric devices, complex oxides, which have a perovskite type crystal structure and can be expressed by a chemical formula $ABO_3$, are known. For example, lead-zirconate-titanate (PZT), which employs lead (Pb) for A, and a mixture of zirconium (Zr) and titanium (Ti) for B, are known.

To improve the characteristics of piezoelectric films, a variety of attempts have been made to align the crystal orientation thereof in a desired orientation.

In the field of superconducting oxides, the formation of in-plane orientated films using an ion-beam assisted sputter method has been proposed (Japanese Laid-open Patent Application HEI 6-145977). Also, a method that uses a cooling apparatus to cool substrates, to set the temperature at the time of film formation to 300° C. or below has been proposed (Japanese Laid-open Patent Application HEI 10-231122).

However, it has been difficult to effectively obtain a piezoelectric film whose crystal orientation is aligned in a desired orientation.

It is an object of the present invention to provide a method for effectively manufacturing a piezoelectric device equipped with a piezoelectric film whose crystal orientation is aligned in a desired orientation.

SUMMARY

A method for manufacturing a piezoelectric device in accordance with the present invention is characterized in comprising the steps of: forming, on a substrate, an interlayer that partially has a layer formed by an ion beam assisted laser ablation method, and is bi-axially oriented as a whole; forming a lower electrode on the interlayer by epitaxial growth; forming a piezoelectric film on the lower electrode by epitaxial growth; and forming an upper electrode on the piezoelectric film.

In the manufacturing method described above, when the layer is formed by an ion beam assisted laser ablation method, a temperature rise caused by ion beam irradiation may preferably be suppressed by using a cooling device. As the cooling device, one using a cooling medium, such as, for example, water, liquid nitrogen or the like, a Peltier element, a freezer or the like is suitable.

In the manufacturing method described above, the film formed by an ion beam assisted laser ablation method may preferably be composed of fluorite type oxide or pyrochlore type oxide.

In the manufacturing method described above, when the layer is formed by an ion beam assisted laser ablation method, a center axis of ablation plume may preferably be generally parallel to a direction normal to the substrate, and an irradiation direction of ion beam may preferably be angled at approximately 55 degrees with respect to the direction normal to the substrate.

A method for manufacturing a liquid jet head in accordance with the present invention comprises: a step of forming a piezoelectric device by the manufacturing method recited above; and a step of forming a cavity, whose inner volume changes by deformation of the piezoelectric film of the piezoelectric device, in the substrate of the piezoelectric device.

A method for manufacturing a liquid jet device in accordance with the present invention is characterized in using the liquid jet head formed by the manufacturing method recited above.

A piezoelectric device in accordance with the present invention pertains to a piezoelectric device formed from a substrate, an interlayer, a lower electrode, a piezoelectric film and an upper electrode, and is characterized in that the interlayer partially has a layer formed by an ion beam assisted laser ablation method, and is bi-axially oriented as a whole.

A liquid jet head in accordance with the present invention pertains to a liquid jet head equipped with the piezoelectric device recited above, and is characterized in that a cavity, whose inner volume changes by deformation of the piezoelectric film, is formed in the substrate.

A liquid jet device in accordance with the present invention is equipped with the liquid jet head recited above.

A thin film forming apparatus in accordance with the present invention is equipped with: an ion source that can irradiate an ion beam on a substrate; a laser beam generation device that irradiates a laser beam to a target disposed opposite to the substrate, and can generate a plume of target-composing particles, and a cooling device that suppresses a temperature rise of the substrate caused by irradiation of the laser beam.

BRIEF DESCRIPTION OF THE DRAWINGS

FIG. 1 is a cross-sectional view indicating piezoelectric devices and a liquid jet head using the same in accordance with embodiments of the present invention.

FIGS. 2[1C]-2[5C] are views for describing a method for manufacturing a piezoelectric device in accordance with the present invention.

DETAILED DESCRIPTION

1. Piezoelectric Device Structure

Figure 3:
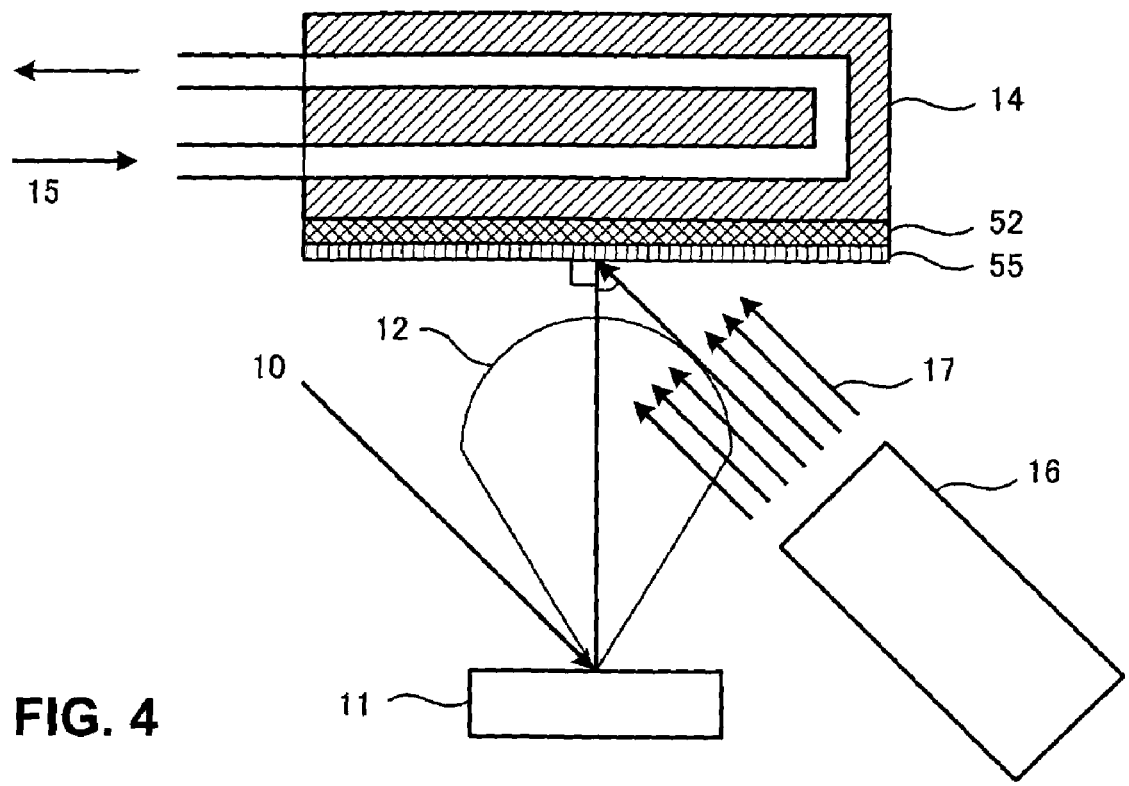
FIG. 3 is a view for describing an ion beam assisted laser ablation method used together with a substrate cooling device in accordance with the present invention.

FIG. 1 is a cross-sectional view indicating an embodiment of a piezoelectric device in accordance with the present invention and a liquid jet head using the same.

A piezoelectric device 54 shown in FIG. 1 has a substrate 52, an interlayer 55 on the substrate 52, a lower electrode 542 on the interlayer 55, a piezoelectric film 543 on the lower electrode 542, and an upper electrode 541 on the piezoelectric film 543.

1-1. Substrate

The substrate 52 has a function to support the lower electrode 542 and the like, and is composed of a member in a flat plate shape.

As the substrate 52, for example, a Si substrate, a SOI (Si on Insulator) substrate or the like can be used. In this case, one having a surface covered with a natural oxidation film or a thermal oxidation film, such as, a $SiO_2$ film, or one of various metal materials, such as, silicon nitride, silicon oxinitride, zirconium oxide and the like can be used.

Also, the substrate 52 may be formed from one of various resin substrates, various metal substrates, or various glass substrates. In this case, the substrate 52 can use, for example, polyethylene, polypropylene, ethylene-propylene copolymers, ethylene-vinyl acetate copolymers (EVA) and other such polyolefins, cyclic polyolefins, modified polyolefins, polyvinyl chloride, polyvinylidene chloride, polystyrenes, polyamides, polyimides, polyamide imides, polycarbonates, poly-(4-methylpentene-1), ionomers, acrylic resins, polymethyl methacrylate, acrylonitrile-butadiene-styrene copolymers (ABS resins), acrylonitrile-styrene copolymers (AS resins), butadiene-styrene copolymers, polyoxymethylene, polyvinyl alcohols (PVA), ethylene-vinyl alcohol copolymers (EVOH), polyethylene terephthalate (PET), polybutylene terephthalate (PBT), polycyclohexane terephthalate (PCT)d and other such polyesters, polyethers, polyether ketones (PEK), polyether ether ketones (PEEK), polyether imides, polyacetals (POM), polyphenylene oxides, modified polyphenylene oxides, polysulfones, polyphenylene sulfides (PPS), polyether sulfones (PES), polyallylates, aromatic polyesters (liquid crystal polymers), polytetrafluoroethylene, polyvinylidene fluoride, and other fluororesins, styrene-based, polyolefin-based, polyvinyl chloride-based, polyurethan-based, polyester-based, polyamide-based, polybutadiene-based, transpolyisoprene-based, fluorine rubber-based, chlorinated polyethylene-based and various other thermoplastic elastomers, epoxy resins, phenolic resins, urea resins, melamine resins, unsaturated polyesters, silicone resins, polyurethanes, or copolymers, blends, polymer alloys or the like consisting primarily thereof, or one of various metal substrates, or a substrate that uses one of various glass materials.

These Si substrate, SOI substrate, various resin substrates, various metal substrates, and various glass substrates are all general purpose substrate. Accordingly, by using one of these substrates as the substrate 52, the manufacturing cost of piezoelectric devices can be reduced.

The substrate 52 may not be specifically limited in its average thickness, but may preferably be about 10 μm-1 mm, and more preferably be about 100-600 μm. By providing the substrate 52 with an average thickness within the aforementioned ranges, the piezoelectric device can be made thinner (smaller in size) while securing a sufficient strength.

1-2. Interlayer

The interlayer 55 composed of a thin film is formed on the substrate 52.

A portion of the layer among the interlayer 55 is formed to be bi-axially oriented by conducting an ion beam assisted laser ablation method while controlling temperature elevations caused by the ion beam irradiation by cooling the substrate. A portion of the layer among the interlayer 55 is bi-axially oriented, and thereafter the layer is epitaxially grown, whereby the entire interlayer 55 becomes bi-axially oriented in its surface. Further, the lower electrode 542 can be epitaxially grown on such an interlayer 55.

The interlayer 55 is not particularly limited in its compositions, but among them, the layer that is bi-axially oriented by an ion beam assisted laser ablation method may preferably be formed from a fluorite type or pyrochlore type metal oxide.

These metal oxides can be bi-axially formed by an ion beam assisted laser ablation method, and are suitable for epitaxially growing the lower electrode 542.

An example of the fluorite type metal oxide may be one of $RE_x (Zr_{1-y} Ce_y)_{1-x} O_{2-0.5x}$ ($0.0 \leq x \leq 1.0$, $0.0 \leq y \leq 1.0$, RE=La, Ce, Pr, Nd, Pm, Sm, Eu, Gd, Tb, Dy, Ho, Er, Tm, Yb, Lu, Y) or a solid solution thereof, and more preferably YSZ, $ZrO_2$, $CeO_2$ or $UO_2$, or a solid solution including the same. In particular, among them, at least one of YSZ, $ZrO_2$, $CeO_2$ and a solid solution thereof may preferably be used.

An example of the pyrochlore type metal oxide may be one of $RE_2 (Zr_{1-y} Ce_y)_2 O_7$ ($0.0 \leq y \leq 1.0$, RE=La, Ce, Pr, Nd, Pm, Sm, Eu, Gd, Tb, Dy, Ho, Er, Tm, Yb, Lu, Y) or a solid solution thereof, and more preferably $La_2Zr_2O_7$, $Nd_2Zr_2O_7$, $Sm_2Zr_2O_7$, $Eu_2Zr_2O_7$, $Gd_2Zr_2O_7$, or the like. In particular, among them, at least one of $Nd_2Zr_2O_7$, $Sm_2Zr_2O_7$, and $Gd_2Zr_2O_7$ may preferably be used.

Also, the interlayer 55 may preferably have a cubic (100) orientation. By orienting the interlayer 55 in a cubic (100) orientation, the lower electrode 542 can be epitaxially grown.

1-3. Lower Electrode

The lower electrode 542 is formed on the interlayer 55. As described above, the interlayer 55 is bi-axially oriented, such that by forming the lower electrode 542 on the interlayer 55, orientations of the lower electrode 542 are aligned. In particular, the lower electrode 542 may preferably be formed by epitaxial growth on the interlayer 55. By forming the lower electrode 542 in this manner, various kinds of properties of the piezoelectric device are improved.

The composition of the lower electrode 542 may preferably be a metal material, such as, for example, Pt, Ir, Ti, Rh, Ru and the like. A plurality of layers of these materials may be formed. For example, the lower electrode may be formed from a laminated structure including 20 nm thick Ti/20 nm thick Ir/140 nm thick Pt. These metal materials have good conductivity.

Also, the lower electrode 542 may be composed of a metal oxide having a perovskite structure. In this case, it may preferably be formed from a metal oxide having a perovskite structure as a main material.

An example of the metal oxide having a perovskite structure may be either $M_2RuO_4$ (M=Ca, Sr, Ba), $RE_2NiO_4$ (RE=La, Ce, Pr, Nd, Pm, Sm, Eu, Gd, Tb, Dy, Ho, Er, Tm, Yb, Lu, Y), $REBa_2Cu_3O_x$ (RE=La, Ce, Pr, Nd, Pm, Sm, Eu, Gd, Tb, Dy, Ho, Er, Tm, Yb, Lu, Y), $MRuO_3$ (M=Ca, Sr, Ba), (RE, M)$CrO_3$ (RE=La, Ce, Pr, Nd, Pm, Sm, Eu, Gd, Tb, Dy, Ho, Er, Tm, Yb, Lu, Y, M=Ca, Sr, Ba), (RE, M)$MnO_3$ (RE=La, Ce, Pr, Nd, Pm, Sm, Eu, Gd, Tb, Dy, Ho, Er, Tm, Yb, Lu, Y, M=Ca, Sr, Ba), (RE,M)$CoO_3$ (RE=La, Ce, Pr, Nd, Pm, Sm, Eu, Gd, Tb, Dy, Ho, Er, Tm, Yb, Lu, Y, M=Ca, Sr, Ba), or $RENiO_3$ (RE=La, Ce, Pr, Nd, Pm, Sm, Eu, Gd, Tb, Dy, Ho, Er, Tm, Yb, Lu, Y) or a solid solution thereof. In particular, $CaRuO_3$, $SrRuO_3$, $BaRuO_3$, $SrVO_3$, (La, Sr)$MnO_3$, (La, Sr)$CrO_3$, (La, Sr)$CoO_3$, LaNiOx, or $YBa_2Cu_3Ox$, or a solid solution including the same may be suitable. In particular, at least one of $CaRuO_3$, LaNiOx, and $YBa_2Cu_3Ox$, or a solid solution including the same is preferred. These metal oxides having a perovskite structure excel in the conductivity and chemical stability. For this reason, the lower electrode 542 can also be provided with excellent conductivity and chemical stability.

The lower electrode 542 having a perovskite structure can be one that is epitaxially grown, for example, in a cubic (100) orientation, a tetragonal (001) orientation, an orthorhombic (100) orientation, a pseudo-cubic (100) orientation, a pseudo-cubic (110) orientation, a pseudo-cubic (111) orientation, or the like. Among them, in particular, one that is epitaxially grown in the cubic (100) orientation or in the pseudo-cubic (100) orientation is preferred.

Also, the average thickness of the lower electrode 542 is not particularly limited, but may preferably be about 10-300 nm, and more preferably, about 50-150 nm. In this way, the lower electrode 542 can fully demonstrate an electrode function.

1-4. Piezoelectric Film

The piezoelectric film 543 is formed on the lower electrode 542. The orientation of the lower electrode 542 is aligned as described above, such that, by forming the piezoelectric film 543 on the lower electrode 542, the crystal orientation of the piezoelectric film 543 is aligned. In particular, the piezoelectric film 543 may preferably be epitaxially grown on the lower electrode.

The piezoelectric film 543 can be composed of any one of a variety of piezoelectric materials, but may preferably include a piezoelectric material having a perovskite structure, and more preferably one containing a piezoelectric material having a perovskite structure as a main constituting material. Further, the piezoelectric material having a perovskite structure may be one that is epitaxially grown in a tetragonal (001) orientation, or may be epitaxially grown in an orthorhombic (100) orientation, but it may be particularly preferred if it is epitaxially grown in the orthorhombic (100) orientation. In this way, various properties thereof including its electric field distortion characteristics improve.

As the piezoelectric material having a perovskite structure, a metal oxide with a perovskite structure, such as, for example, Pb(Zr, Ti) $O_3$(PZT), (Pb, La)(Zr, Ti)$O_3$(PLZT), (Ba, Sr)TiO$_3$(BST), BaTiO$_3$, KNbO$_3$, Pb(Zn, Nb)O$_3$(PZN), Pb(Mg, Nb)O$_3$(PMN), PbFeO$_3$, and PbWO$_3$, Bi-layered compounds, such as, SrBi$_2$(Ta, Nb)$_2$O$_9$, (Bi, La)$_4$Ti$_3$O$_{12}$, or a solid solution including the same (PMN-PT, PZN-PT, etc.) may be enumerated. Among the above, in particular, PZT, BST, or a relaxer material such as PMN-PT, PZN-PT, or the like may be preferred. Furthermore, the piezoelectric material may preferably include a solid solution PMN$_y$-PZT$_{1-y}$ of a relaxer material PMN that is composed of one or a mixed phase of Pb(M$_{1/3}$ N$_{2/3}$)O$_3$(M =Mg, Zn, Co, Ni, Mn, N=Nb, Ta), Pb(M$_{1/2}$ N$_{1/2}$)O$_3$(M=Sc, Fe, In, Yb, Ho, Lu, N=Nb, Ta), Pb(M$_{1/2}$ N$_{1/2}$)O$_3$(M=Mg, Cd, Mn, Co, N=W, Re), and Pb(M$_{2/3}$N$_{1/3}$)O$_3$(M=Mn, Fe, N=W, Re), and Pb(Zr$_x$Ti$_{1-x}$)O$_3$ (PZT, $0.0 \leq x \leq 1.0$). In this way, the piezoelectric device 54 is provided with various excellent characteristics.

It is noted that, when the lower electrode 542 includes a metal oxide having a perovskite structure (in particular, may be one having a metal oxide having a perovskite structure as a main constituting material), the metal oxide having a perovskite structure has few lattice mismatches with a piezoelectric material having a perovskite structure. For this reason, the piezoelectric film 543 can be readily and securely epitaxially grown in a tetragonal (001) orientation on the lower electrode 542. Also, the piezoelectric film 543 has an improved bonding property with the lower electrode 542.

Also, an average thickness of the piezoelectric film 543 is not particularly limited, but may preferably be about 100-3000 nm, for example, and more preferably, about 500-2000 nm. By setting the average thickness of the piezoelectric film 543 to the ranges described above, enlargement of the piezoelectric device 54 can be prevented, and the piezoelectric device that can well demonstrate its various characteristics can be obtained.

1-5. Upper Electrode

The upper electrode 541 is formed on the piezoelectric film 543. As a constituting material of the upper electrode 541, for example, one of Pt, Ir, Au, Ag, Ru and an alloy including any of the above or two or more of them combined can be used.

Also, an average thickness of the upper electrode 541 is not particularly limited, but may preferably be about 10-300 nm, and more preferably, about 50-150 nm.

2. Method for Manufacturing Piezoelectric Device

Next, referring to FIGS. 2[1C]-[5C], a method for manufacturing a piezoelectric device is described.

The method for manufacturing the piezoelectric device 54 indicated below includes a step of forming an interlayer 55 on a substrate 52 (interlayer forming step), a step of forming a lower electrode 542 on the interlayer 55 (lower electrode forming step), a step of forming a piezoelectric film 543 on the lower electrode 542 (piezoelectric film forming step), a step of forming an upper electrode 541 on the piezoelectric film 543 (upper electrode forming step), and a step of patterning the piezoelectric film and the upper electrode (patterning step). These steps are described below one by one.

First, the substrate 52 is prepared. The substrate 52 to be used may preferably have a uniform thickness without warps or flaws.

[1C] Interlayer Forming Step

Next, the interlayer 55 is formed on the substrate 52. This may be conducted, for example, in the following manner.

FIG. 3 schematically shows an explanatory view of a film forming apparatus that is used for the interlayer forming step. First, the substrate 52 is mounted on a substrate holder, and placed in a vacuum chamber.

It is noted that a first target 11 including constituting elements of the aforementioned interlayer 55 is disposed opposite to and separated from the substrate 52 at a predetermined distance. It is noted that the first target 11 to be preferably used may be composed of the same compositions as or similar compositions to those of the interlayer 55 to be obtained.

Then, as a laser beam 10 is irradiated at the first target 11, atoms including oxygen atoms and metal atoms are pounded out (released or emitted) from the first target 11, and a plume 12 is generated. In other words, the plume 12 is irradiated toward the substrate 52. Then, the plume 12 eventually contacts the substrate 52.

The laser beam 10 may preferably be a pulsed beam with a wavelength of about 150-300 nm, and a pulse length of about 1-100 ns. More specifically, the laser beam 10 may be, for example, an excimer laser such as an ArF excimer laser, KrF excimer laser, a XeCl excimer laser, or the like, a YAG laser, YVO$_4$ laser, CO$_2$ laser or the like. Among the above, the ArF excimer laser and the KrF excimer laser are particularly preferred. The ArF excimer laser and the KrF excimer laser are easy to handle, and can effectively pound (release) atoms from the first target.

In this instance, a center axis of the ablation plume 12 may preferably be adjusted to be generally in parallel with a direction normal to the substrate 52, as shown in FIG. 3.

Also, when a bi-axially oriented layer is to be formed by an ion beam assisted laser ablation method, an ion beam 17 is generally concurrently irradiated to a surface of the substrate 52, inclined at a predetermined angle.

In this instance, the ion beam 17 to be irradiated to the surface of the substrate 52 is not particularly limited, but at least one type of ions of inert gases, such as, for example, argon, helium, neon, xenon and krypton, or mixed ions of the aforementioned ions and oxygen ions may be enumerated.

As an ion source 16 of the ion beam, for example, a Kauffman ion source or the like may preferably be used. By using this ion source, the ion beam can be relatively readily generated.

Also, the angle (the predetermined angle) of the irradiation direction of the ion beam 17 with respect to the direction normal to the substrate surface may preferably be about 55°, as shown in FIG. 3, and may preferably be, for example, 53° or greater but 57° or smaller, and most preferably, 54° or greater but 56° or smaller. By irradiating the ion beam 17 to the surface of the substrate 52 with its irradiation angle set in this manner, the interlayer 55 that has a cubic (100) orientation and is bi-axially oriented can be formed.

In this instance, if the substrate temperature rises with irradiation of the ion beam, the control of the orientation of the interlayer 55 becomes difficult. Accordingly, as shown in FIG. 3, a cooling apparatus 14 that uses cooling medium such as water, liquid nitrogen or the like, or a cooling apparatus such as a Peltier element, a freezer or the like, is used to control the temperature rise. The example shown in FIG. 3 uses a cooling medium 15.

Any conditions are applicable in forming the interlayer 55 if the interlayer 55 can be in-plane oriented, and they may be set, for example, as follows.

The frequency of the laser beam may preferably be 30 Hz or lower, and more preferably, 15 Hz or lower.

The energy density of the laser beam may preferably be 0.5 j/cm$^2$ or greater, and more preferably, 2 j/cm$^2$ or greater.

The acceleration voltage of the ion beam may preferably be about 100-300V, and more preferably, about 150-250V.

The irradiation amount of the ion beam may preferably be about 1-30 mA, and more preferably, about 2-10 mA.

The temperature of the substrate 52 is prevented by the cooling device 14 from rising due to the ion beam irradiation, but may preferably be 70° C. or lower, and more preferably, 30° C. or lower.

The distance between the substrate 52 and the first target 11 may preferably be about 30 mm-100 mm, and more preferably, 50-80 mm.

The pressure inside the vacuum apparatus may preferably be $133 \times 10^{-1}$ Pa ($1 \times 10^{-1}$ Torr) or less, and more preferably, $133 \times 10^{-3}$ Pa ($1 \times 10^{-3}$ Torr) or less.

The atmosphere inside the vacuum apparatus may preferably be a mixture of inert gas and oxygen at a mixing ratio of about 100:1-2:1 in volume ratio, and more preferably, about 20:1-5:1.

In this instance, the irradiation time of the laser beam and ion beam may be appropriately set, such that the thickness of the interlayer 55 can be adjusted to be in the ranges described above. The irradiation time of the laser beam and ion beam may differ depending on each of the conditions described above, but, normally, may preferably be 100 minutes or longer, and more preferably, 150 minutes or longer.

Among the interlayer 55, a layer that is bi-axially oriented by an ion beam assisted laser ablation method may be formed under conditions that are within the ranges described above, such that the layer can be more effectively bi-axially oriented.

Figure 4:
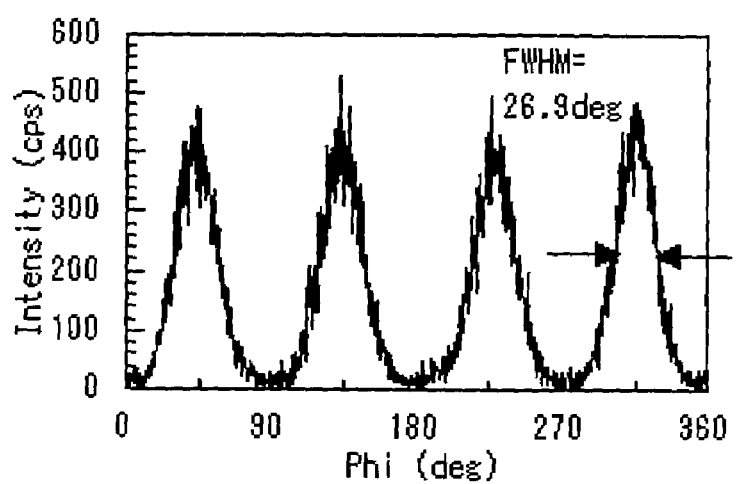
FIG. 4 is a graph showing measurement results of XRD φ scan of an YSZ interlayer manufactured by a method according to an embodiment of the present invention.

For example, under conditions where the irradiation angle of the ion beam 17 with respect to the surface of the substrate 52 (the angle to the direction normal to the substrate surface 52) is 55°, the frequency of the laser beam is 10 Hz, the energy density of the laser beam is 2 J/cm$^2$, the acceleration voltage of the ion beam is 200V, the irradiation amount of the ion beam is 8 mA, the temperature of the substrate 52 is 100° C., the distance between the substrate 52 and the first target is 70 mm, the pressure inside the vacuum apparatus is $133 \times 10^{-3}$ Pa ($1 \times 10^{-3}$ Torr), the mixing ratio of inert gas and oxygen is 10:1 in volume ratio, and the irradiation time of the laser beam and ion beam is 165 minutes, a 1 µm thick YSZ layer was deposited as the interlayer 55. In this case, as shown in FIG. 4, a (111) plane of the YSZ layer that has a cubic (100) orientation provided a reading of a full width at half maximum of XRD φ scan at 27°.

Further, without changing the conditions other than the substrate temperature, the substrate 52 was cooled by using water to suppress the temperature rise with the ion beam irradiation to change the substrate temperature. In this case, as shown in Table 1, the full width at half maximum of XRD φ scan of the (111) plane of YSZ became smaller than 27° as the substrate temperature lowered, and the degree of in-plane orientation improved. Similar results were obtained when liquid nitrogen was used for cooling.

TABLE 1

| Substrate Temperature (° C.) | Full width at half maximum of XRD φ scan of YSZ (111) (deg) | Full width at half maximum of XRD φ scan of SrRuO$_3$ (101) (deg) | Full width at half maximum of XRD φ scan of PZT (101) (deg) | d 31 (pC/N) |
|---|---|---|---|---|
| Without ion beam assist | — | — | — | 160 |
| 100 | 27 | 25 | 23 | 200 |
| 70 | 25 | 23 | 21 | 200 |
| 50 | 22 | 20 | 18 | 220 |
| 20 | 20 | 18 | 15 | 240 |
| −50 | 15 | 12 | 10 | 250 |

It is noted that, after a portion of the layer that is bi-axially oriented has been formed by an ion beam assisted laser ablation method, the interlayer 55 can be formed by epitaxial growth without ion beam irradiation. In this instance, the interlayer may be formed by epitaxial growth using a CVD method, a sputter method, a sol-gel method or the like, without being limited to the method described above.

[2C] Lower Electrode Forming Step

Next, the lower electrode 542 is formed on the interlayer 55. The lower electrode 54 can be formed, for example, in the following manner.

Prior to forming the lower electrode 542, instead of the first target, a second target including constituting elements of the aforementioned lower electrode 542 is disposed opposite to and separated from the interlayer 55 on the substrate 52 at a predetermined distance. It is noted that the second target to be preferably used may be composed of the same compositions as or similar compositions to those of the lower electrode 542 to be obtained.

Continuously succeeding the step [1C], atoms including various metal atoms (and oxygen atoms if applicable) composing the lower electrode are pounded out (released or emitted) onto the interlayer 55, and a plume is generated. The plume eventually contacts a surface (upper surface) of the interlayer 55.

This plume may preferably be generated, in a manner similar to the aforementioned step [1C], by irradiating a laser beam to the surface of the second target, and pounding atoms including various metal atoms out of the second target.

The laser beam may preferably be an ArF excimer laser or a KrF excimer laser, like the aforementioned step [1C].

Any conditions are applicable in forming the lower electrode 542 if the respective metal atoms reach the interlayer 55 in a predetermined ratio (for example, in the composition ratio of metal oxide having a perovskite structure), and the lower electrode 542 can be formed, and they may be set, for example, as follows.

The frequency of the laser beam may preferably be 30 Hz or lower, and more preferably, 15 Hz or lower.

The energy density of the laser beam may preferably be 0.5 j/cm$^2$ or greater, and more preferably, 2 j/cm$^2$ or greater.

The temperature of the substrate 52 with the interlayer 55 formed thereon may preferably be about 300-800° C., and more preferably, about 400-700° C.

The distance between the substrate 52 with the interlayer 55 formed thereon and the second target may preferably be about 30 mm-100 mm, and more preferably, about 50-80 mm.

The pressure inside the vacuum apparatus may preferably be less than 1 atmospheric pressure, in which a partial pressure of oxygen may preferably be 133×10$^{-3}$ Pa (1×10$^{-3}$ Torr) or greater under supply of oxygen gas, and preferably, 133×10$^{-5}$ Pa(1×10$^{-5}$ Torr) under supply of atomic oxygen radicals.

Also, in this instance, the irradiation time of the laser beam may be appropriately set, such that the average thickness of the lower electrode 542 can be adjusted to be in the ranges described above. The irradiation time of the laser beam may differ depending on each of the conditions described above, but, normally, may preferably be 30-90 minutes, and more preferably, about 60 minutes.

By setting each of the conditions in forming the lower electrode 542 in the corresponding range, the lower electrode 542 can be effectively formed.

For example, under conditions where the frequency of the laser beam is 10 Hz, the energy density of the laser beam is 2 J/cm$^2$, the temperature of the substrate 52 is 600° C., the distance between the substrate 52 and the second target is 70 mm, the partial pressure of oxygen under supply of oxygen gas is 133×10$^{-2}$ Pa(1×10$^{-2}$ Torr), and the irradiation time of the laser beam is 60 minutes, a 100 nm thick SrRuO$_3$ layer was deposited as the lower electrode 542. In this case, a pseudo-cubic (101) plane of the SrRuO$_3$ layer that has a pseudo-cubic (100) orientation provided a reading of a full width at half maximum of XRD φ scan at 25°.

In this instance, when only the substrate temperature, while depositing the interlayer 55 by an ion beam assisted laser ablation method, was changed, the full width at half maximum of XRD φ scan of the pseudo-cubic (101) plane of SrRuO$_3$ became smaller than 25° as the substrate temperature lowered, as shown in Table 1 above, and the degree of in-plane orientation improved.

In the manner described above, the lower electrode 542 is obtained.

It is noted that the lower electrode 542 may be formed by epitaxial growth using a CVD method, a sputter method, a sol-gel method or the like, without being limited to the method described above.

[3C] Piezoelectric Film Forming Step

Next, the piezoelectric film 543 is formed on the lower electrode 542. This can be done, for example, in the following manner.

Prior to forming the piezoelectric film 543, instead of the second target, a third target including constituting elements of the aforementioned piezoelectric film 543 is disposed opposite to and separated from the substrate 52 at a predetermined distance. It is noted that the third target to be preferably used may be composed of the same compositions as or similar compositions to those of the piezoelectric film 543 to be obtained.

Continuously succeeding the step [2C] described above, a plume of atoms including oxygen atoms and various metal atoms is irradiated onto the lower electrode 542. The plume eventually contacts a surface (upper surface) of the lower electrode 542, whereby the piezoelectric film 543 including the piezoelectric material (as described above) having a perovskite structure is formed in a film shape in, for example, a tetragonal (001) orientation by epitaxial growth.

This plume may preferably be generated, in a manner similar to the aforementioned step [1C], by irradiating a laser beam to the surface of the third target, and pounding atoms including oxygen atoms and various metal atoms out of the third target.

The laser beam may preferably be an ArF excimer laser or a KrF excimer laser, like the aforementioned step [1C].

Any conditions are applicable in forming the piezoelectric film 543 if the respective metal atoms reach the lower electrode 542 in a predetermined ratio (in other words, in the composition ratio of piezoelectric material having a perovskite structure), and the piezoelectric film 543 can be formed, and they may be set, for example, as follows.

The frequency of the laser beam may preferably be 30 Hz or lower, and more preferably, 15 Hz or lower.

The energy density of the laser beam may preferably be 0.5 j/cm$^2$ or greater, and more preferably, 2 j/cm$^2$ or greater.

The temperature of the substrate 52 with the lower electrode 542 formed thereon may preferably be about 300-800° C., and more preferably, about 400-700° C.

The distance between the substrate 52 with the lower electrode 542 formed thereon and the third target may preferably be about 30 mm-100 mm, and more preferably, about 50-80 mm.

Also, the pressure inside the vacuum apparatus may preferably be less than 1 atmospheric pressure, in which a partial pressure of oxygen may preferably be 133×10$^{-3}$ Pa (1×10$^{-3}$ Torr) or greater under supply of oxygen gas, and preferably, 133×10$^{-5}$ Pa(1×10$^{-5}$ Torr) or greater under supply of atomic oxygen radicals.

Also, in this instance, the irradiation time of the laser beam may be appropriately set, such that the average thickness of the piezoelectric film 543 can be adjusted to be in the ranges described above. The irradiation time of the laser beam may differ depending on each of the conditions described above, but, normally, may preferably be 60 minutes or longer, and more preferably, 120 minutes or longer.

By setting each of the conditions in forming the piezoelectric film 543 in the corresponding range, the piezoelectric film 543 can be effectively formed.

For example, under conditions where the frequency of the laser beam is 10 Hz, the energy density of the laser beam is 2 J/cm$^2$, the temperature of the substrate 52 is 600° C., the distance between the substrate 52 and the third target is 70 mm, the partial pressure of oxygen under supply of oxygen gas is 133×10$^{-2}$ Pa(1×10$^{-2}$ Torr), and the irradiation time of the laser beam is 180 minutes, a 1 µm thick Pb(Zr$_{0.55}$ Ti$_{0.45}$)O$_3$ (PZT) layer was deposited as the piezoelectric film 543. In this case, a (101) plane of the PZT layer that has a (100) orientation provided a reading of a full width at half maximum of XRD φ scan at 23°.

In this instance, when only the substrate temperature, when depositing the interlayer 55 by an ion beam assisted laser ablation method, was changed, the full width at half maximum of XRD φ scan of the (101) plane of PZT became smaller than 23° as the substrate temperature lowered, as shown in Table 1 above, and the degree of in-plane orientation improved.

In the manner described above, the piezoelectric film 543 is obtained.

It is noted that the piezoelectric film 543 may be formed by epitaxial growth using a CVD method, a sputter method, a sol-gel method or the like, without being limited to the method described above.

[4C] Upper Electrode Forming Step

Next, as shown in FIG. 2 [4C], the upper electrode 541 is formed on the piezoelectric film 543. More specifically, platinum (Pt) or the like is formed into a film having a film thickness of 100 nm as the upper electrode 541 by a DC sputter method.

[5C] Patterning Step

Next, as indicated in FIG. 2 [5C], the piezoelectric film 543 and the upper electrode 541 are processed into a predetermined configuration to form a piezoelectric device. More specifically, resist is spin-coated on the upper electrode 541, exposed in a predetermined configuration, and developed for patterning. By using the remaining resist as a mask, the upper electrode 541 and the piezoelectric film 543 are etched by ion milling or the like.

The piezoelectric constant of the piezoelectric device manufactured was evaluated, which resulted in $d_{31}$=200 pC/N. This is greater, compared to $d_{31}$=160 pC/N which is a value obtained when an ion beam is not used in forming the interlayer 55, and indicates an improvement in the piezoelectric property.

Furthermore, when only the substrate temperature, when depositing the interlayer 55 by an ion beam assisted laser ablation method, was changed in the manufacturing, the value $d_{31}$ became greater than 200 pC/N as the substrate temperature lowered, as shown in Table 1 above, and the piezoelectric property improved as the degree of in-plane orientation improved.

Through the steps [1C]-[5C] described above, the piezoelectric device 54 is manufactured.

3. Ink Jet Type Recording Head Structure

An ink jet recording head that is a liquid jet head equipped with a piezoelectric device in accordance with the present invention is described.

Figure 5:
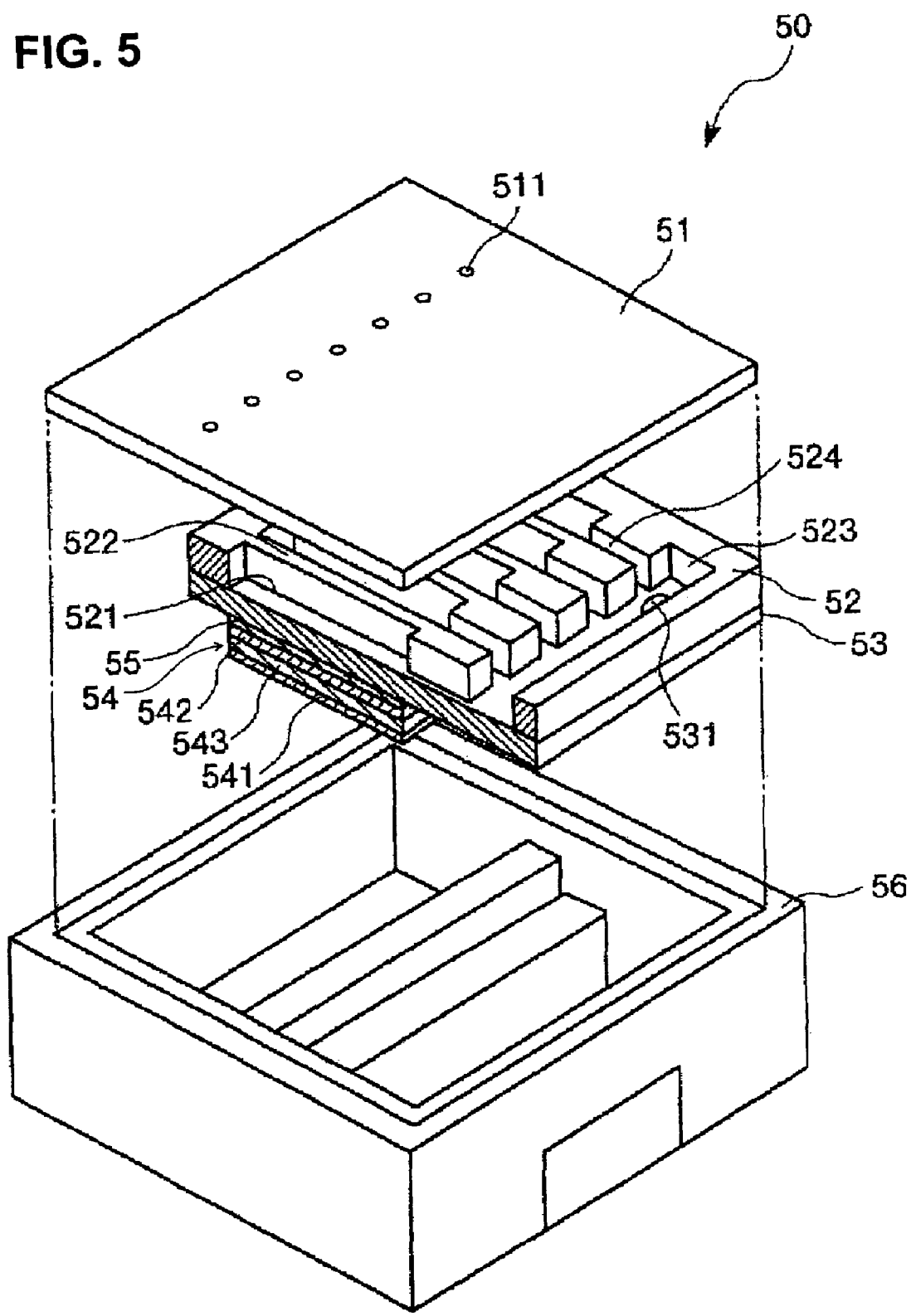
FIG. 5 is an exploded perspective view of an ink jet recording head in accordance with an embodiment of the present invention.

FIG. 5 is an exploded perspective view of an ink jet recording head in accordance with an embodiment of the present invention. FIG. 1 described above is a cross-sectional view of the structure of a main portion of the ink jet recording head shown in FIG. 5. It is noted that FIG. 5 shows the head upside down with respect to a state in which it is normally used.

An ink jet recording head 50 shown in FIG. 5 (hereafter, simply referred to as the "head 50") is equipped with a nozzle plate 51, an ink chamber substrate 52, a vibration plate 53, and piezoelectric elements (vibration sources) 54 that are bonded to the vibration plate 53, which are housed in a base substrate 56. The head 50 forms an on-demand type piezoelectric head.

The nozzle plate 51 is formed from, for example, a rolled plate of stainless steel. Multiple nozzles 511 for jetting ink droplets are formed in the nozzle plate 51. The pitch of the nozzles 511 may be appropriately set according to printing precisions.

The ink chamber substrate 52 is fixedly bonded (affixed) to the nozzle plate 51. The ink chamber substrate 52 has a plurality of ink chambers (cavities, pressure chambers) 521, a reservoir 523 that temporarily reserves ink that is supplied from an ink cartridge 631, and supply ports 524 that supply the ink from the reservoir 523 to the respective ink chambers 521, which are defined by the nozzle plate 51, side walls (partition walls) 522 and the vibration plate 53 to be described below.

Each of the ink chambers 521 is formed in a rectangle shape (rectangular parallelepiped shape), and disposed for each of the corresponding nozzles 511. Each of the ink chambers 521 has a volume that is varied by vibrations of the vibration plate 53 to be described below, and is formed to eject ink by the volume change.

As a base material for obtaining the ink chamber substrate 52, for example, a silicon single crystal substrate, a variety of glass substrates, and a variety of plastic substrates can be used. These substrates are all general purpose substrates, such that, by using these substrates, the manufacturing cost for the head 50 can be reduced.

Among them, a (110) oriented silicon single crystal substrate may preferably be used as the base material. The (110) oriented silicon single crystal substrate is suitable for anisotropic etching, such that the ink chamber substrate 52 can be readily and securely formed.

The average thickness of the ink chamber substrate 52 is not particularly limited, but may preferably be about 10-1000 μm, and more preferably, about 100-500 μm.

Also, the volume of the ink chamber 521 is not particularly limited, but may preferably be about 0.1-100 nL, and more preferably, 0.1-10 nL.

The vibration plate 53 is bonded to the ink chamber substrate 52 on the opposite side of the nozzle plate 51, and a plurality of piezoelectric elements 54 are provided on the vibration plate 53 through a buffer layer 55 that is an interlayer on the opposite side of the ink chamber substrate 52.

Also, a communication hole 531 that penetrates the vibration plate in its thickness direction is formed in the vibration plate 53 at a predetermined position. Ink can be supplied from an ink cartridge 631 to be described below to the reservoir 523 through the communication hole 531.

Each of the piezoelectric elements 54 is respectively interposed between the lower electrode 542 and the upper electrode 541 through the piezoelectric film 543, and disposed in a position corresponding generally to a center portion of each of the ink chambers 521. Each of the piezoelectric elements 54 is electrically connected to a piezoelectric element driving circuit to be described below, and is composed to operate (vibrate, deform) based on signals of the piezoelectric element driving circuit.

Each of the piezoelectric elements 54 functions as a vibration source, wherein the vibration plate 53 vibrates by vibrations of the piezoelectric element 54, and functions to instantaneously increase the inner pressure of the ink chamber 521.

The base substrate 56 is composed of, for example any one of various resin materials, any one of metal materials, or the like, and the ink chamber substrate 52 is affixed to and supported by the base substrate 56.

In a state in which a predetermined jetting signal is not inputted through the piezoelectric element driving circuit, in other words, in a state in which no voltage is applied across the lower electrode 542 and the upper electrode 541 of the piezoelectric element 54, no deformation occurs in the piezoelectric film 543 of the head 50. For this reason, no deformation occurs in the vibration plate 53, and no volume change occurs in the ink chamber 521. Accordingly, no ink droplet is jetted from the nozzle 511.

On the other hand, in a state in which a predetermined jetting signal is inputted through the piezoelectric element driving circuit, in other words, in a state in which a predetermined voltage is applied across the lower electrode 542 and the upper electrode 541 of the piezoelectric element 54, a deformation occurs in the piezoelectric film 543. In this way, the vibration plate 53 is greatly flexed, thereby causing a change in the volume of the ink chamber 521. At this moment, the pressure within the ink chamber 521 instantaneously increases, and an ink droplet is jetted from the nozzle 511.

When one ejection of the ink is completed, the piezoelectric element driving circuit stops application of the voltage across the lower electrode 542 and the upper electrode 541. In this way, the piezoelectric element 54 returns generally to its original shape, such that the volume of the ink chamber 521 increases. It is noted that, at this moment, a pressure (pressure in a positive direction) works on the ink in a direction from the ink cartridge 631 to be described below toward the nozzle 511. For this reason, air is prevented from entering the ink chamber 521 from the nozzle 511, and an amount of ink matching with the jetting amount of ink is supplied from the ink cartridge 631 through the reservoir 523 to the ink chamber 521.

In this manner, by inputting jetting signals successively through the piezoelectric element driving circuit to the piezoelectric elements 54 at positions to be printed, the head 50 can print arbitrary (desired) characters and figures.

4. Method for Manufacturing Ink Jet Recording Head

Next, one example of a method for manufacturing the head 50 is described. The head 50 described above can be manufactured, for example, in the following manner.

First, a base material that becomes an ink chamber substrate 52 and a vibration plate 53 are adhered (bonded) together into one piece.

For this bonding, for example, a method for conducting a heat treatment in a state in which the base material and the vibration plate 53 are contact-bonded is preferably used. By such a method, the base material and the vibration plate 53 can be readily and securely formed into one piece.

Conditions of the heat treatment are not particularly limited, but may preferably be at 100-600° C. for about 1-24 hours, and more preferably, 300-600° C. for about 6-12 hours. It is noted that, for the bonding, one of a variety of other bonding methods or a variety of fusing methods or the like can be used.

Next, piezoelectric elements 54 are formed on the vibration plate 53 through a buffer layer 55. This can be performed in a manner similar to the steps [1C]-[5C] described above.

Next, concave sections that become ink chambers 521 are formed in the base material that becomes the ink chamber substrate 52 at positions corresponding to the piezoelectric elements 54, and concave sections that become a reservoir 523 and supply ports 524 are formed at predetermined positions.

More specifically, a mask layer that matches with the positions of the ink chambers 521, the reservoir 523 and the supply ports 524 is formed, and then, a dry etching, such as, for example, a parallel flat plate reactive ion etching method, inductive coupled plasma method, electron cyclotron resonance method, helicon wave excitation method, magnetron method, plasma etching method, ion beam etching method, or the like, or a wet etching with a high concentration alkaline solution in an amount of about 5 to 40 wt % of potassium hydroxide, tetramethylammonium hydroxide or the like, is conducted.

In this way, the base material is cut (removed) in its thickness direction to the extent that the vibration plate 53 is exposed, thereby forming the ink chamber substrate 52. It is noted that, in this instance, portions that remain without being etched become side walls 522, and the vibration plate 52 exposed assumes a state that can function as a vibration plate.

It is noted that, when a (110) oriented silicon substrate is used as the base material, the base material can be readily anisotropically etched by using the high concentration alkaline solution, such that the ink chamber substrate 52 can be readily formed.

Next, a nozzle plate 51 formed with a plurality of nozzles 511 is bonded such that each of the nozzles 511 is alighted to correspond to each of the concave sections that become the respective ink chambers 521. In this way, the plurality of ink chambers 521, the reservoir 523 and the plurality of supply ports 524 are defined.

For this bonding, for example, one of a variety of bonding methods including bonding with adhesive, one of a variety of fusing methods or the like can be used.

Next, the ink chamber substrate 52 is attached to the base substrate 56. In the manner described above, the ink jet recording head 50 can be obtained.

5. Ink Jet Printer

An ink jet printer, which is a liquid jet device equipped with an ink jet recording head of the present invention, is described.

Figure 6:
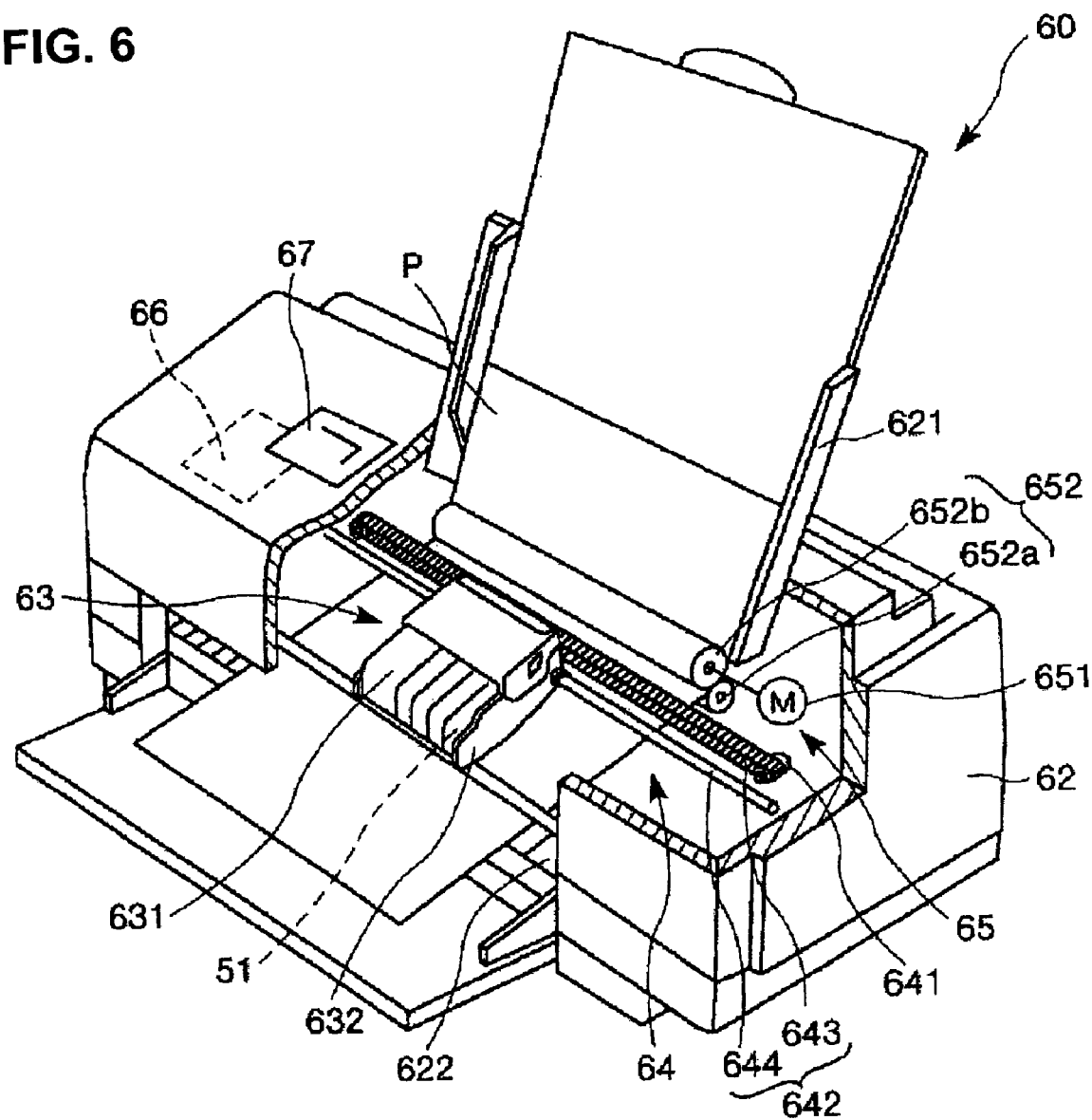
FIG. 6 schematically shows an ink jet printer in accordance with an embodiment of the present invention.

FIG. 6 schematically shows an ink jet printer in accordance with an embodiment of the present invention. It is noted that, an upper side in FIG. 6 refers to an "upper section" and a lower side therein refers to a "lower section" in the following descriptions.

An ink jet printer 60 shown in FIG. 6 is equipped with an apparatus main body 62, in which a tray 621 for holding recording paper P in an upper rear section thereof, a discharge port 622 for discharging the recording paper P to a lower front section thereof, and an operation panel 67 on an upper surface thereof are provided.

The operation panel 67 is formed from, for example, a liquid crystal display, an organic EL display, an LED lamp, and is equipped with a display section (not shown) for displaying error messages and the like, and an operation section (not shown) composed of various switches and the like.

Also, the apparatus main body 62 mainly has on its inside a printing device (printing means) 64 equipped with a head unit 63 that can reciprocate, a paper feeding device (paper feeding means) 65 for feeding recording paper P one by one into the printing device 64, and a control section (control means) 66 for controlling the printing device 64 and the paper feeding device 65.

By the control of the control section 66, the paper feeding device 65 intermittently feeds the recording paper P one by one. The recording paper P passes near a lower section of the head unit 63. In this moment, the head unit 63 reciprocally moves in a direction generally perpendicular to a feeding direction of the recording paper P, and prints on the recording paper P. In other words, the reciprocal movements of the head unit 63 and the intermittent feeding of the recording paper P define a main scanning and an auxiliary scanning, respectively, thereby performing printing by an ink jet method.

The printing device 64 is equipped with the head unit 63, a carriage motor 641 that is a driving source for the head unit 63, and a reciprocating mechanism 642 that receives rotations of the carriage motor 641 to reciprocate the head unit 63.

The head unit 63 includes the ink jet recording head 50 equipped with multiple nozzles 511 in its lower section, ink cartridges 631 that supply inks to the ink jet recording head 50, and a carriage 632 on which the ink jet recording head 50 and the ink cartridges 631 are mounted.

It is noted that the ink cartridges 631 that are filled with four colors of yellow, cyan, magenta and black may be used, to enable full-color printing. In this case, the head unit 63 may be provided with the ink Jet recording heads 50 corresponding to the respective colors.

The reciprocating mechanism 642 includes a carriage guide shaft 643 having both ends thereof supported by a frame (not shown), and a timing belt 644 that extends in parallel with the carriage guide shaft 643.

The carriage 632 is freely reciprocally supported by the carriage guide shaft 643, and affixed to a portion of the timing belt 644.

By operations of the carriage motor 641, the timing belt 644 is moved in a positive or reverse direction through pulleys, and the head unit 63 reciprocally moves, guided by the carriage guide shaft 643. During these reciprocal movements, the ink is jetted from the ink jet recording head 50, to print on the recording paper P.

The paper feeding device 65 includes a paper feeding motor 651 and a paper feeding roller 652 that is rotated by operations of the paper feeding motor 651.

The paper feeding roller 652 is composed of a follower roller 652a and a driving roller 652b that are disposed up and down and opposite each other with a feeding path of the recording paper P (i.e., the recording paper P) being interposed between them, and the driving roller 652b is coupled to the paper feeding motor 651. In this way, the paper feeding roller 652 can feed the multiple recording papers P disposed in the tray 621 one by one, toward the printing device 64. It is noted that, instead of the tray 621, a paper feeding cassette for storing recording paper P may be mounted in a freely detachable manner.

The control section 66 controls the printing device 64, the paper feeding device 65 and the like to perform printing based on print data inputted from a host computer, such as, for example, a personal computer, digital camera, and the like.

The control section 66 is equipped mainly with a memory that stores control programs and the like to control the respective sections, a piezoelectric element driving circuit that drives the piezoelectric elements (vibration source) 54 and controls ink jetting timings, a driving circuit that drives the printing device 64 (carriage motor 641), a driving circuit that drives the paper feeding device 65 (paper feeding motor 651), a communication circuit that obtains printing data from a host computer, and a CPU that is electrically connected to these circuits, and performs various controls at each of the sections, although none of them are illustrated.

Also, the CPU is electrically connected to various kinds of sensors that can detect the amount of ink remaining in the ink cartridges 631, and printing environments such as the position, temperature, humidity and the like of the head unit 63.

The control section 66 obtains printing data through the communication circuit, and stores the same in the memory. The CPU processes the printing data, and outputs driving signals to the corresponding driving circuits based on the processed data and input data from the variety of sensors. Based on the driving signals, the piezoelectric elements 54, the printing device 64 and the paper feeding device 65 are operated. In this way, printing is performed on the recording paper P.

6. Others

Although the piezoelectric device, the ink jet recording head, and the ink jet printer in accordance with the present invention are described above based on the illustrated embodiments, the present invention is not limited to them.

For example, each of the sections that compose the piezoelectric device, the ink jet recording head, and the ink jet printer in accordance with the present invention, can be replaced for an arbitrary one that demonstrates similar functions, or provided with other additional compositions.

Also, for example, arbitrary steps can be added to the methods for manufacturing a piezoelectric device and an ink jet recording head, respectively.

Also, the structure of the ink jet recording head in accordance with the present embodiment described above is also applicable to, for example, a liquid jet mechanism of a variety of industrial liquid jet apparatuses. In this case, the liquid jet apparatus can use, besides the inks described above (color dye inks such as yellow, cyan, magenta, black and the like), for example, solutions and liquid materials having a viscosity that is appropriate for jetting from nozzles (liquid jetting ports) of the liquid jetting mechanism.

What is claimed is:

1. A method for manufacturing a piezoelectric device, comprising the steps of:
    forming, on a substrate, an interlayer that partially has a layer formed by an ion beam assisted laser ablation method, and is bi-axially oriented as a whole;
    forming a lower electrode on the interlayer by epitaxial growth;
    forming a piezoelectric film on the lower electrode by epitaxial growth; and
    forming an upper electrode on the piezoelectric film,
    wherein a center axis of an ablation plume is generally parallel to a direction normal to the substrate when the layer is formed by an ion beam assisted laser ablation method, and an irradiation direction of an ion beam is angled at approximately 55 degrees with respect to the direction normal to the substrate.

2. The method for manufacturing a piezoelectric device according to claim 1, wherein a temperature rise caused by ion beam irradiation is suppressed by using a cooling device when the layer is formed by an ion beam assisted laser ablation method.

3. The method for manufacturing a piezoelectric device according to claim 1 wherein the film formed by an ion beam assisted laser ablation method comprises at least one of a fluorite oxide and a pyrochlore oxide.

* * * * *